United States Patent
Yoshida et al.

(10) Patent No.: US 9,343,872 B2
(45) Date of Patent: May 17, 2016

(54) OPTICAL AMPLIFICATION DEVICE AND OPTICAL AMPLIFICATION METHOD

(71) Applicant: FUJITSU LIMITED, Kawasaki-shi, Kanagawa (JP)

(72) Inventors: Setsuo Yoshida, Inagi (JP); Susumu Kinoshita, Fuchu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/628,514

(22) Filed: Feb. 23, 2015

(65) Prior Publication Data

US 2015/0280398 A1 Oct. 1, 2015

(30) Foreign Application Priority Data

Mar. 27, 2014 (JP) ................................ 2014-066331

(51) Int. Cl.
*H01S 5/06* (2006.01)
*H01S 5/50* (2006.01)

(52) U.S. Cl.
CPC ...... *H01S 5/06* (2013.01); *H01S 5/50* (2013.01)

(58) Field of Classification Search
CPC ................ H01S 5/05; H01S 5/06; H01S 5/40
See application file for complete search history.

(56) References Cited

U.S. PATENT DOCUMENTS

| 5,636,045 A * | 6/1997 | Okayama ................ H04J 14/08 398/1 |
| 6,404,525 B1 * | 6/2002 | Shimomura ........... H04B 10/03 398/82 |
| 2002/0131118 A1* | 9/2002 | Chiaroni ............. H04J 14/0204 398/83 |
| 2006/0023298 A1* | 2/2006 | Ohshima ............. H01S 3/06754 359/349 |
| 2009/0058534 A1 | 3/2009 | Ueno et al. |
| 2009/0208227 A1* | 8/2009 | Yoshida ................ H04B 10/27 398/202 |
| 2014/0139909 A1* | 5/2014 | Kinoshita .......... H04B 10/2914 359/341.33 |

FOREIGN PATENT DOCUMENTS

JP 2009-55550 A 3/2009

* cited by examiner

*Primary Examiner* — Eric Bolda
(74) *Attorney, Agent, or Firm* — Fujitsu Patent Center

(57) ABSTRACT

An optical amplification device includes: a port group that has a plurality of ports that have a semiconductor optical amplifier and a port that does not have a semiconductor optical amplifier, an optical burst signal being input into each of the ports at a different timing; and a control unit, wherein: when an optical inputting into the port that has the semiconductor optical amplifier is detected, the control unit activates the semiconductor optical amplifier of the port where the optical inputting is detected, inactivates the other semiconductor optical amplifier and remains an activation until another optical inputting is detected in another semiconductor optical amplifier; and when an optical inputting into the port that does not have the semiconductor optical amplifier is detected, the control unit inactivates the semiconductor optical amplifiers of the plurality of the ports that have the semiconductor optical amplifier.

7 Claims, 12 Drawing Sheets

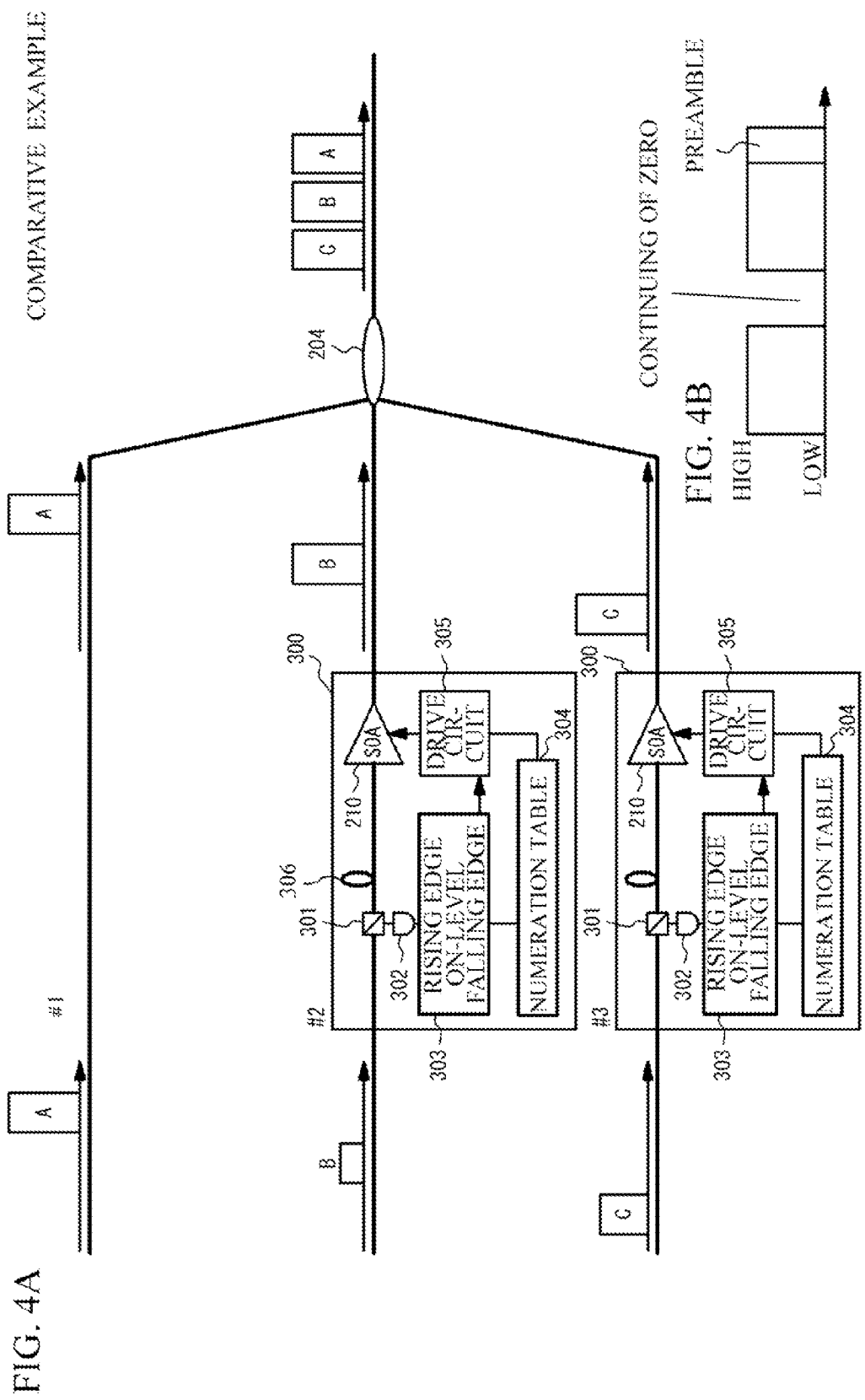

OPTICAL AMPLIFICATION DEVICE AND OPTICAL AMPLIFICATION METHOD

CROSS-REFERENCE TO RELATED APPLICATION

This application is based upon and claims the benefit of priority of the prior Japanese Patent Application No. 2014-066331, filed on Mar. 27, 2014, the entire contents of which are incorporated herein by reference.

FIELD

A certain aspect of embodiments described herein relates to an optical amplification device kind an optical amplification method.

BACKGROUND

A technology in which an SOA (Semiconductor Optical Amplifier) is used as a gate switch by activating or inactivating the SOA is disclosed (see Japanese Patent Application Publication No. 2009-55550).

SUMMARY

According to an aspect of the present invention, there is provided an optical amplification device comprising: a port group that has a plurality of ports that have a semiconductor optical amplifier and a port that does not have a semiconductor optical amplifiers an optical burst signal being input into each of the ports at a different timing; an optical coupler that combines output signals output from the port group; a detection unit that detects an optical inputting to the port group; and a control unit, wherein: when an optical inputting into the port that has the semiconductor optical amplifier is detected, the control unit activates the semiconductor optical amplifier of the port where the optical inputting is detected, inactivates the other semiconductor optical amplifier and remains an activation until another optical inputting is detected in another pore and when an optical inputting into the port that does not have the semiconductor optical amplifier is detected, the control unit inactivates the semiconductor optical amplifiers of the plurality of the ports that have the semiconductor optical amplifier.

According to another aspect of the present invention, there is provided an optical amplification method of an optical amplification device combining output signals output by a port group that has a plurality of ports that have a semiconductor optical amplifier and a port that does not have a semiconductor optical amplifier, an optical burst signal being input into each of the ports at a different timing, the method comprising: when an optical inputting into the port that has the semiconductor optical amplifier is detected, activating the semiconductor optical amplifier of the port where the optical inputting is detected, inactivating the other semiconductor optical amplifier, and remaining an activation until another optical inputting is detected in another port; and when an optical inputting into the port that does not have the semiconductor optical amplifier is detected, inactivating the semiconductor optical amplifiers of the plurality of the ports that have the semiconductor optical amplifier.

According to another aspect of the present invention, there is provided an optical amplification device comprising: a first port that has a semiconductor amplifier, an optical burst signal being input into the first port; a second port that does not have a semiconductor amplifier, an optical burst signal being into the second port at a different timing from the first port; an optical coupler that combines output signals output from the first port and the second port; a detection unit that detects an optical inputting to the first port and the second port; and a control unit, wherein: when an optical inputting into the first port is detected, the control unit activates the semiconductor optical amplifier and remains an activation until another optical inputting is detected in the second port; and when an optical inputting into the second port is detected, the control unit inactivates the semiconductor optical amplifiers of first port.

According to another aspect of the present invention, there is provided an optical amplification method of an optical amplification device combining output signals output by a first port that has a semiconductor optical amplifier and a second port that does not have a semiconductor optical amplifier, an optical burst signal being input into each of the first and second ports at a different timing, the method comprising: when an optical inputting into the first port is detected, activating the semiconductor optical amplifier and remaining an activation until another optical inputting is detected in the second port; and when an optical inputting into the second port is detected, inactivating the semiconductor optical amplifiers of first port.

BRIEF DESCRIPTION OF DRAWINGS

FIG. 4A illustrates a block diagram of a level control device in accordance with a comparative example;

FIG. 4B illustrates a degradation of a signal caused by continuing of zero;

DESCRIPTION OF EMBODIMENTS

In a PON (Passive Optical Network) repeater, an SOA may be used as an optical gate switch and an optical amplifier having a level control function, an optical signal may be amplified by activating the SOA when an optical inputting is detected (an optical intensity is equal to a threshold or more), and the optical signal may be shut down by inactivating the SOA when the optical inputting is not detected (the optical intensity is less than the threshold). In the structure, when an optical burst signal is input, as detection of inputting of an optical signal is possible because an input optical intensity is stable in a preamble of each optical burst signal. However, when a continuing of zero continues after the preamble of the optical burst signal, the SOA is inactivated. When the SOA is inactivated by the continuing of zero, a changing of an optical intensity is unstable in a signal indicating "1" after the continuing of zero. Therefore, it is difficult to detect the signal indicating "1" without fail. Therefore it is difficult to output an optical burst signal of which optical intensity is stable.

The following is a description of embodiments, with reference to the accompanying drawings.

First Embodiment

Figure 1A:
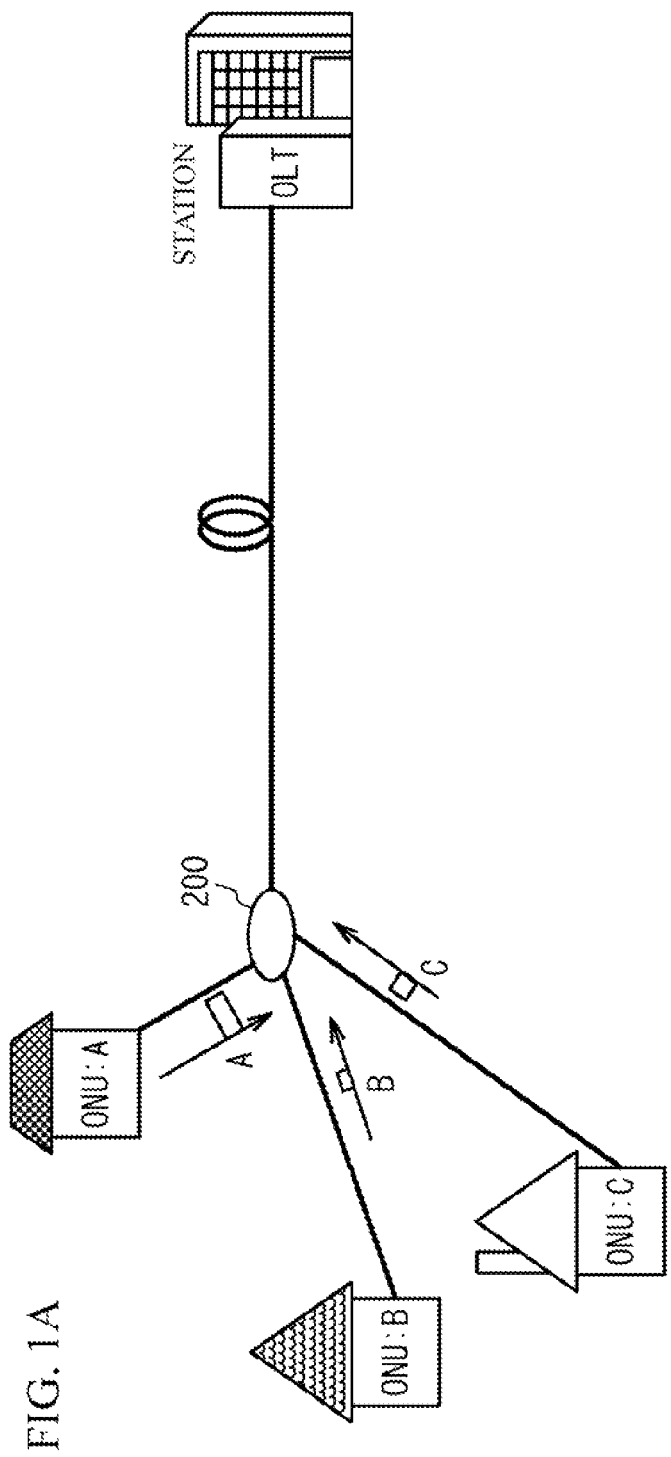
FIG. 1A illustrates a schematic view of a PON system.

FIG. 1A illustrates a schematic view of a PON (Passive Optical Network) system. As illustrated in FIG. 1A, a remote node 200 for an optical amplification is provided between an OLT (Optical Line Terminal) acting as a station and each ONU (Optical Network Unit). A downbound optical signal transmitted by the OLT is amplified by the remote node 200 and is transmitted to each ONU. An upbound optical signal transmitted by each ONU is amplified by the remote node 200 and is transmitted to the OLT.

A timing of transmitting and receiving an optical signal is controlled between the OLT and each ONU. An optical signal is transmitted from each ONU to the OLT at a different timing in the upbound direction from each ONU to the OLT. Optical signals A to C are optical signals transmitted by ONUs that are different from each other. An optical signal transmitted intermittently and discontinuously is referred to as an optical burst signal. In the upbound direction from each ONU to the OLT, distances from ONUs to the remote node 200 are different from each other. Therefore, optical loss amounts occurring in paths from ONUs to the remote node 200 are different from each other. And, there is variability in optical intensity of optical burst signals arriving at the remote node 200. The remote node 200 is a device for adjusting optical intensity of each optical burst signal and transmitting each optical burst signal by a time-division multiplexing.

Figure 1B:
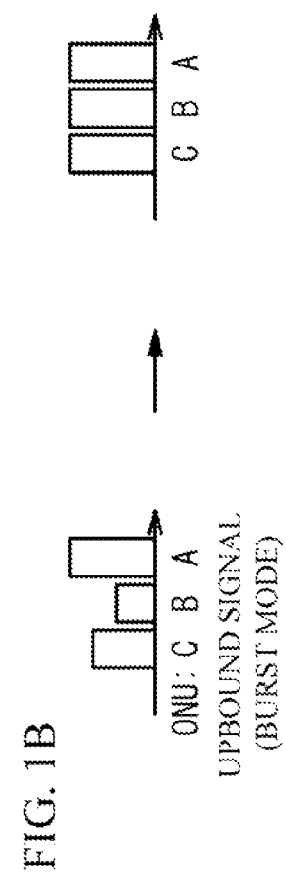
FIG. 1B illustrates an optical signal transmitted from each ONU to an OLT.

FIG. 1B illustrates adjusting of optical intensity by the remote node 200. As illustrated in FIG. 1B, there is variability in optical intensity of optical burst signals arriving at the remote node 200. After adjusting the optical intensity by the remote node 200, the variability of optical intensity of burst signals is suppressed.

Figure 2:
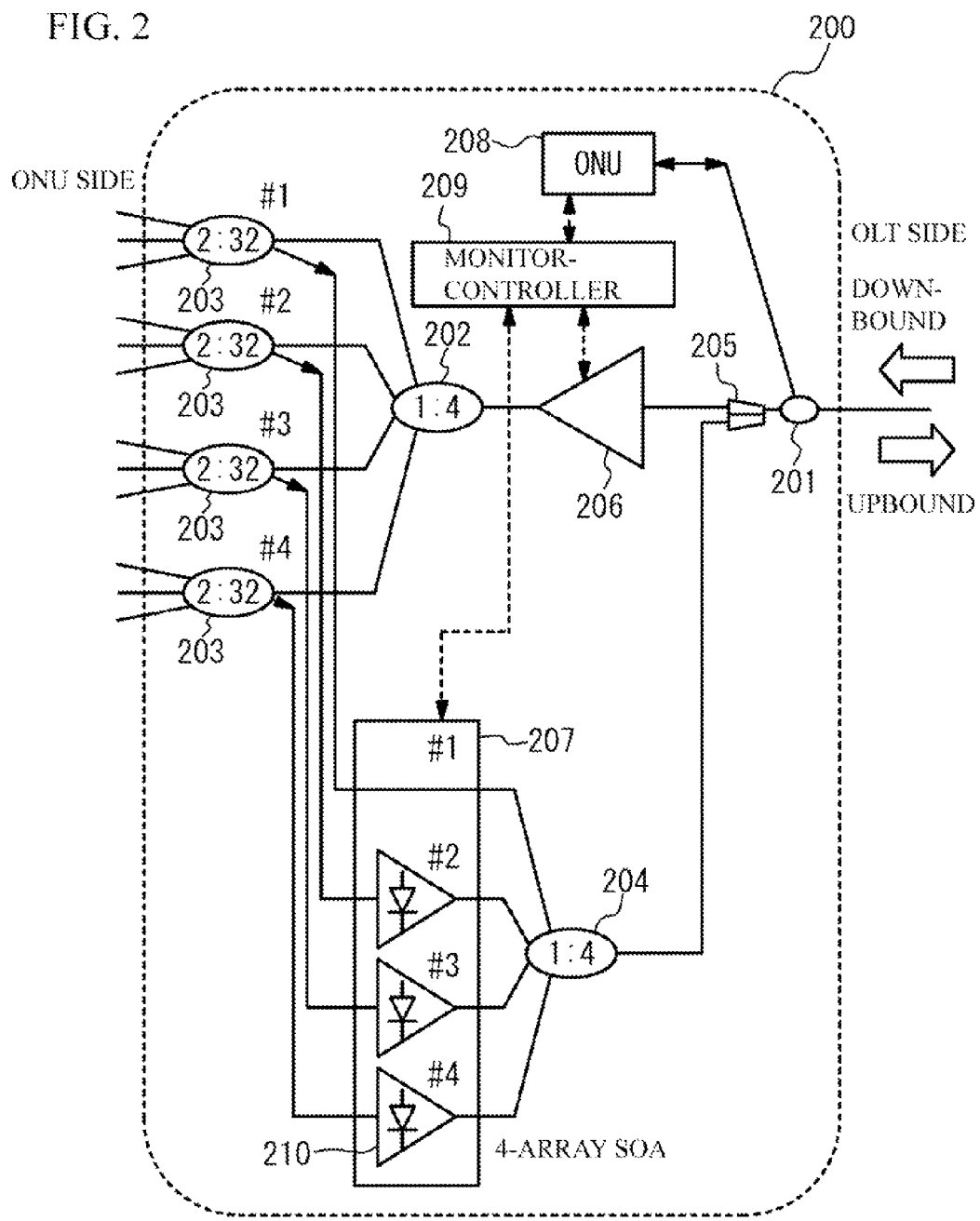
FIG. 2 illustrates a block diagram of a structure of a remote node.

FIG. 2 illustrates a block diagram for describing a structure of the remote node 200. As illustrated in FIG. 2, the remote node 200 has optical couplers 201 to 204, a multiplexer-demultiplexer 205, a fiber amplifier 206, an optical amplification module 207, an ONU 208, a monitor-controller 209 and so on. Next, a description will be given of an outline of an operation of the remote node 200.

An optical signal from the OLT in a downbound direction is input into the optical coupler 201. The optical coupler 201 inputs a part of the optical signal in the downbound direction into the ONU 208 and inputs the rest into the multiplexer-demultiplexer 305. The ONU 308 transmits information relating to the input optical signal to the monitor-controller 209. On the other hand, the ONU 208 receives and transmits information with the our via the optical coupler 201. The multiplexer-demultiplexer 205 inputs an optical signal input by the optical coupler 201 into the fiber amplifier 206. The fiber amplifier 206 amplifies the optical signal in accordance with an instruction from the monitor-controller 209 and inputs the amplified optical signal into an optical coupler 202.

The optical coupler 202 branches the optical signal from the fiber amplifier 206 into a plurality of optical signals. In the example of FIG. 2, the optical coupler 202 is a 1:4 coupler and thereby branches an optical signal into four optical signals. The number of an optical coupler 203 is the same as that of the branching number of the optical coupler 202. In the example of FIG. 2, four optical couplers 203 are provided according to port numbers #1 to #4. Each optical coupler 203 branches the optical signal from the optical coupler 202 into a plurality of optical signals. In the example of FIG. 2, the optical coupler 203 is a 2:32 coupler and branches the optical signal from the optical coupler 202 into 32 optical signals.

The optical burst signal from each ONU in the upbound direction is input into any of the optical couplers 203 of #1 to #4 at a different timing. The optical coupler 203 inputs the optical burst signal from the ONU into the optical amplification module 207. The optical amplification module 207 has a plurality of ports of which number is the same as the number of the optical couplers 203 according to the port numbers #1 to #4. Two or more of the ports have a SOA (Semiconductor Optical Amplifier) 210. One or more of the ports does not have any semiconductor optical amplifier. In the embodiment, the port of #1 does not have any semiconductor optical amplifier. The ports of #2 to #4 have a semiconductor optical amplifier 210. Each optical coupler 203 and each SOA 210 are optically coupled to each other by 1:1. For example, the optical coupler 203 of #2 is optically coupled to the SOA 210 of #2. The SOA 210 amplifies the optical burst signal in accordance with an instruction from the monitor-controller 209 and inputs the amplified optical burst signal into the optical coupler 204. The optical coupler 204 time-division multiplexes the optical burst signal from each port and inputs the time-division-multiplexed optical burst signal into the multiplexer-demultiplexer 205. The multiplexer-demultiplexer 205 outputs the optical burst signal from the optical coupler 204 to the OLT via the optical coupler 201.

Each SOA 210 absorbs an input light when a drive voltage is 0V. In this case, each SOA 210 acts as a shutter. On the other hand each SOA 210 outputs a light with a gain according to the drive voltage when the drive voltage more than 0 V is input. Therefore, each SOA 210 acts as a gate switch operating according to the drive voltage.

Figure 3A:
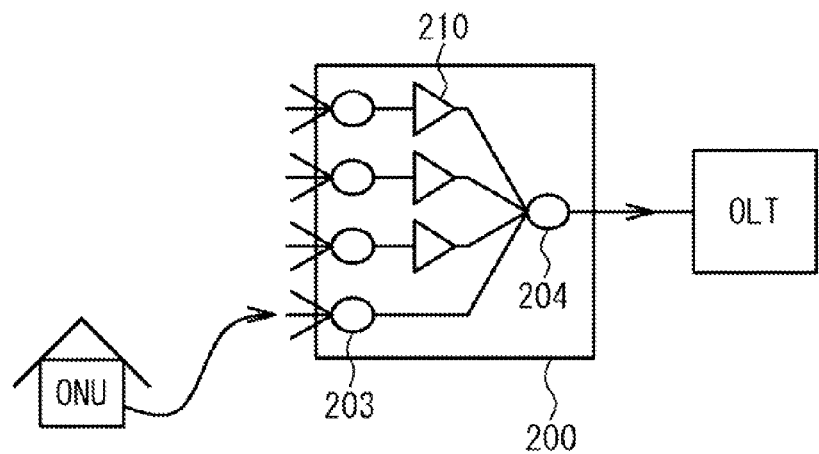
FIG. 3A and FIG. 3B illustrate a reason that there is a port having no semiconductor optical amplifier.
Figure 3B:
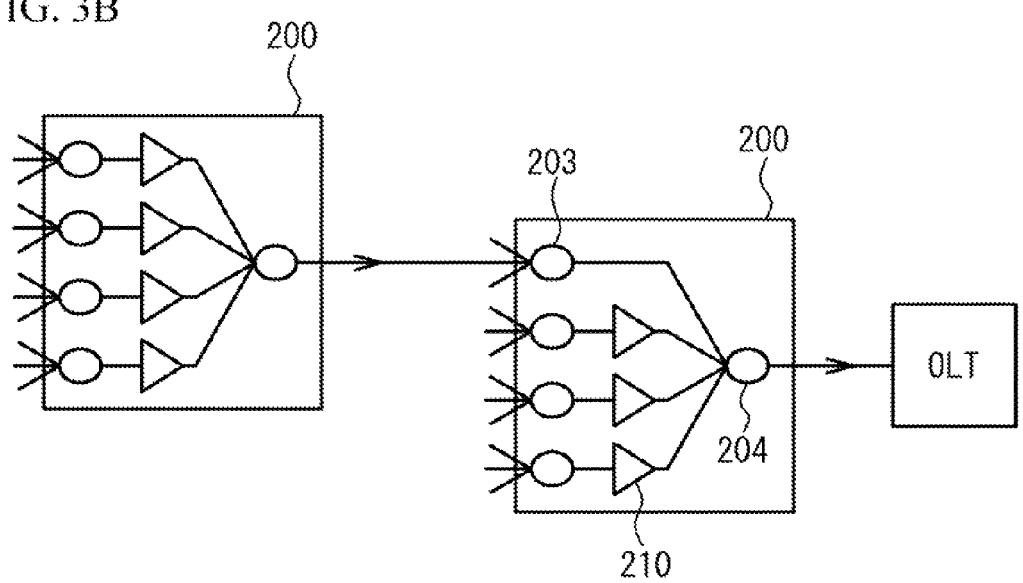

A description will be given of a reason that there is a port having no semiconductor optical amplifier. As illustrated in FIG. 3A, when a distance from the ONU to the remote node 200 is small, an optical burst signal having strong optical intensity reaches the remote node 200. In this case, it is not necessary to amplify the optical burst signal. Therefore, it is no necessary for a port into which the optical burst signal is input to have the SOA 210. As illustrated in FIG. 3B, there is a case where a plurality of the remote nodes 200 are used as repeaters and a distance between the remote nodes is small. In this case, a first remote node 200 inputs an optical burst signal having strong optical intensity into a second remote node 200. In this case, it is also not necessary to amplify the optical burst signal. Therefore, it is not necessary for a port into which the optical burst signal is input to have the SOA 210.

FIG. 4A illustrates a block diagram for describing a level control device in accordance with a comparative example. The level control device is a process device that controls an optical level (optical intensity) of each optical burst signal in the upbound direction and corresponds to the optical amplification module 207 and the monitor-controller 209 of FIG. 2. In FIG. 2, the optical amplification module 207 has four ports. However, in FIG. 4A, the port numbers #1 to #3 are described.

In the example of FIG. 4A, level control devices 300 of the port numbers #2 and #3 are provided. The port of #1 does not have the level control device 300 because optical intensity of an optical burst signal A input into the port of #1 is close to a desirable value. The level control device 300 has the SOA 210, an optical coupler 301, a light-receiving element 302, an individual control unit 303, a numeration table unit 304, a drive circuit 305 and a delay line 306.

Next, a description will be given of an operation of the level control device 300. The optical coupler 301 inputs a part of an input optical burst signal into the light-receiving element 302, and inputs the rest into the SOA 210. The light-receiving element 302 detects optical intensity of the input optical burst signal. When the individual control unit 303 detects a rising edge of the optical burst signal detected by the light-receiving element 302, the individual control unit 303 reads optical intensity (on-level) after the rising edge and gives the optical intensity to the numeration table unit 304. The numeration table unit 304 searches a drive voltage value for controlling the on-level value to a desirable constant optical level and gives a searched drive voltage value to the drive circuit 305. The drive circuit 305 applies a drive voltage of the received drive voltage value to the SOA 210. The delay line (optical fiber) 306 is inserted between the optical coupler 301 and the SOA 210. A delay time of the delay line 306 is the same as a time of a control delay from a time when an optical burst signal reaches the light receiving element 302 to a time when a drive voltage is applied to the SOA 210. Thus, the SOA 210 is activated without a lack of a burst signal caused by the time of the control delay. And, an optical level of die optical burst signal input into the SOA 210 is controlled to be a desirable value. After that, the individual control unit 303 transmits an off-signal to the drive circuit 305 when the individual control unit 303 detects a falling edge of an optical signal detected by the light-receiving element 302. The drive circuit 305 controls the drive voltage to the SOA 210 to be zero when receiving the off-signal. Thus, the SOA 210 is inactivated.

In the comparative example, the optical burst signal A input into the port of #1 is not amplified. An optical level of an optical burst signal B input into the level control device 300 of #2, and an optical level of an optical burst signal C input into the level control device 300 of #3 are controlled to be a desirable value. Thus, a variability of the optical levels of optical burst signals output from the optical coupler 204 is suppressed. However, in the structure of the comparative example, when a continuing of zero continues in the optical burst signal B or C, the SOA 210 to which the optical burst signal is input is inactivated and the optical burst signal is degraded.

FIG. 4B illustrates a degradation of a signal caused by the continuing of zero. As illustrated in FIG. 4B, an optical burst signal from each ONU has a high level (1) and a low level (0). The optical burst signal from each ONU has a preamble as a head. The preamble is a scramble portion (Sync Time) in which a pattern is fixed. For example, the preamble is a signal in which "0" and "1" are arrayed alternately. When a rising edge is detected and the SOA 210 is activated in a period when the preamble is input, an optical level of a signal after the preamble is amplified to a desirable level. It is therefore possible to detect the signal after the preamble with high accuracy. However in the optical signal from each ONU, the continuing of zero may occur when the low level continues. When the continuing of zero occurs, a falling edge is detected. Thus, the SOA 210 is inactivated. In this case, when a high level indicating "1" is input, a pattern after the high level is not a preamble but a main body of data (payload). Therefore, the pattern is not a fixed pattern. For example, another continuing of zero may occur just after a first "1" after the continuing of zero in the payload finishes. On the other fluid, a response speed of the light-receiving element 302 is kite so that the light-receiving element 302 cannot response to "1" and "0" that are one bit of an optical burst signal. The light-receiving element 302 reads an average optical intensity in a bit pattern in which "1" and "0" appear 50% by 50% averagely (reading on-level). Thus, the light-receiving element 302 estimates that a level of "1" that is one bit of the optical burst signal is twice as the optical intensity of the average optical intensity. Therefore, when another continuing of zero occurs again just after a first "1" after the continuing of zero finishes, an intensity of a rising edge detected by "1" may be detected weakly in the light-receiving element 302. In an extreme case, file detected intensity does not exceed a threshold. Therefore, the rising edge is not detected. In the case, the SOA is not activated. Therefore, the "1" is not output, and data lacking may occur. In a case where a data just after a first "1" after the continuing of zero is not a continuing of zero, when a bit pattern has more "0" than "1", a rising edge detected by the light-receiving element 302 rises more moderately than a case where "0" and "1" appear 50% by 50%. Therefore, a time required for exceeding a threshold for detecting a rising edge is longer than a case of a rising edge by a preamble. Accordingly, the time of control delay is longer than a delay time by the delay line 306 inserted with a view that a rising edge is detected in a preamble. Therefore, the timing for activating die SOA is delayed. And a lacking or a degradation of an output signal may occur. Further, when a bit pattern has less "0" than "1" or a bit pattern has more "0" than "1", the bit patterns are not a bit pattern in which "1" and "0" appear 50% by 50%. In this case, even if a rising edge is detected, an optical intensity of an on-level after the rising edge cannot be detected with high accuracy. Therefore, a drive voltage that is different from a drive voltage to be applied essentially is applied to the SOA. Accordingly, the optical intensity of an output optical burst signal cannot be controlled to be constant.

Figure 5:
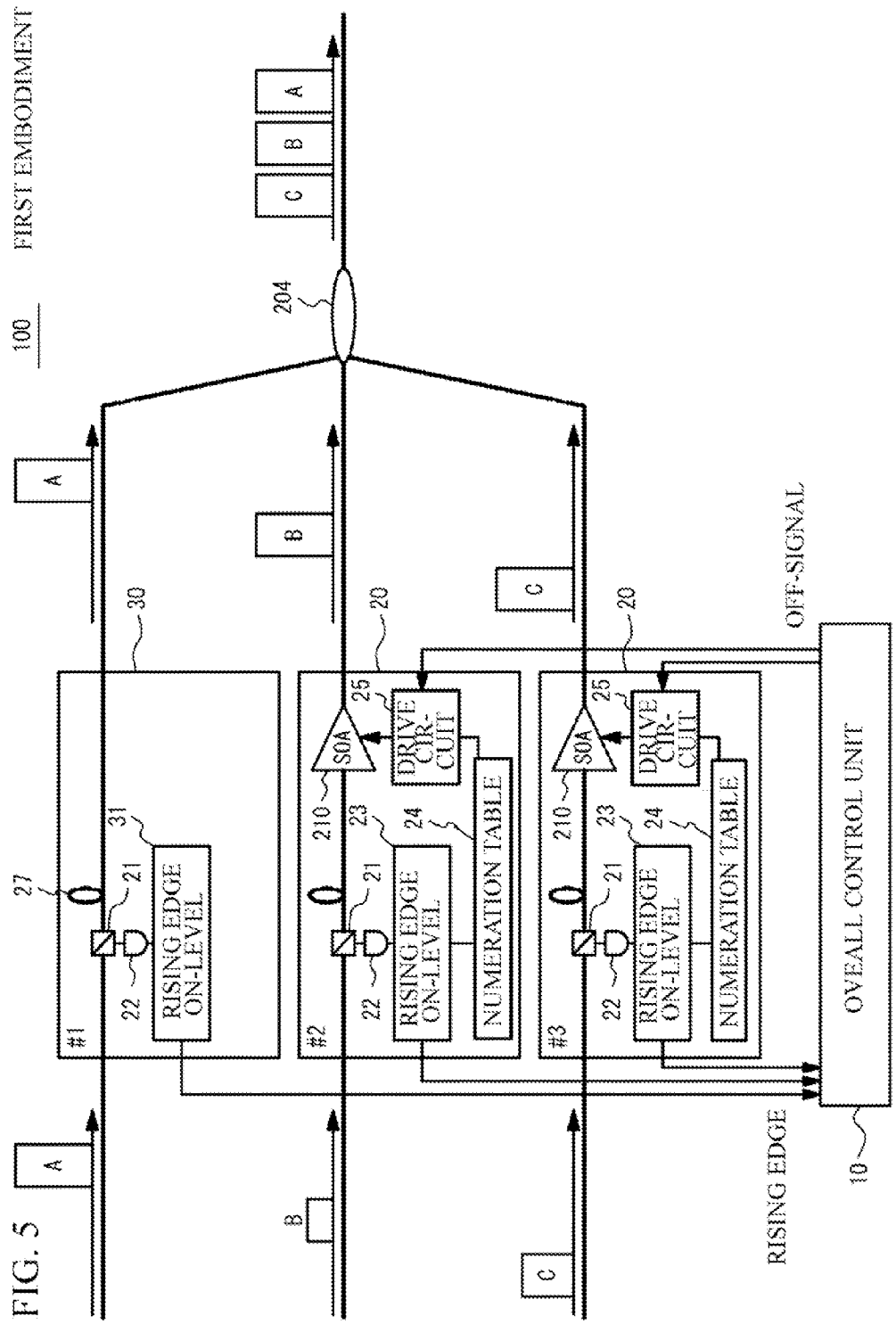
FIG. 5 illustrates a block diagram of an overall structure of an optical amplification device in accordance with a first embodiment.

And so, in the embodiment, a description will be given of an optical amplification device that is capable of stabilizing optical intensity of an optical burst signal. FIG. 5 illustrates a block diagram for describing an overall structure of an optical amplification device 100 in accordance with the embodiment. The optical amplification device 100 corresponds to the optical amplification module 207 and the monitor-controller 209 of FIG. 2. In FIG. 2, four ports are provided in the optical amplification module 207. However, the port numbers #1 to #3 are described in FIG. 5.

The optical amplification device 100 has an overall control unit 10, and level control devices 20 of the port numbers #2 and #3. The port of #1 does not have the level control device 20 because the optical intensity of the optical burst signal A input into the port of #1 is close to a desirable value. The port of #1 has a detection device 30. The level control device 20 has the SOA 210, an optical coupler 21, a light-receiving element 22, an individual control unit 23, a numeration table unit 24, a drive circuit 25, a delay line 27 and a detection unit 31.

Next, a description will be given of an operation of the level control device 20 and the detection device 30. In the level control device 20, the optical coupler 21 inputs a part of an input optical burst signal into the light-receiving element 22, and inputs the rest of the optical burst signal into the SOA 210. In the detection device 30, the optical coupler 21 inputs a part of an input optical burst signal into the light-receiving element 22, and inputs the rest of the optical burst signal into the optical coupler 204. The light-receiving element 22 detects an optical intensity of the input optical burst signal. The individual control unit 23 reads an optical intensity (on-level) after a rising edge, when the individual control unit 23 detects the rising edge of the optical burst signal detected by the light-receiving element 22. The individual control unit 23 gives the optical intensity to the numeration table unit 24 and transmits a rising detection signal indicating a detection of a rising edge to the overall control unit 10. The detection unit 31 transmits a rising detection signal indicating a detection of a rising edge to the overall control unit 10 when the detection unit 31 detects a rising edge of the optical burst signal detected by the light-receiving element 22.

The numeration table unit 24 searches a drive voltage value fir adjusting a value of an on-level to a desirable constant optical level, and gives a searched drive voltage value to the drive circuit 25. The drive circuit 25 applies a drive voltage having the drive voltage value to the SOA 210. The delay line 27 is inserted between the optical coupler 21 and the SOA 210. The delay line 27 causes a delay time that is the same as the time of control delay from a time when an optical burst signal reaches the light-receiving element 22 to a tune when a drive voltage is applied to the SOA 210. Thus, the SOA 210 can be activated without a lacking of the burst signal because of the time of control delay. And, the optical level of the optical burst signal input into the SOA 210 can be controlled to be a desirable value.

On the other hand, the overall control unit 10 transmits an off-signal for instructing inactivation to the drive circuit 25 of the level control devices 20 other than the level control device 20 having transmitted a rising detection signal, when receiving a rising detection signal from any of the level control devices 20. In this case, the overall control unit 10 sets a "light incidence flag" to be "0" with respect to the port of #1 that does not have the level control device 20. The overall control unit 10 transmits an off-signal to the drive circuits 25 of all of the level control devices 20 and sets the light incidence flag to be "1" with respect to the port of #1 that does not have the level control device 20 when receiving a rising detection signal from the detection device 30.

The drive circuit 25 that receives the off-signal changes the drive voltage of the SOA 210 to zero. Thus, the SOA 210 is inactivated. For example, when the level control device 20 of #2 transmits the rising detection signal, the SOA 210 of the level control device 20 of #3 is inactivated. When the detection device 30 of #1 transmits the rising detection signal, the SOAs 210 of the level control devices 20 or #2 and #3 are inactivated. The SOA 210 of the level control device 20 having detected the rising remains the activation until another rising edge is detected in another port.

Figure 6:
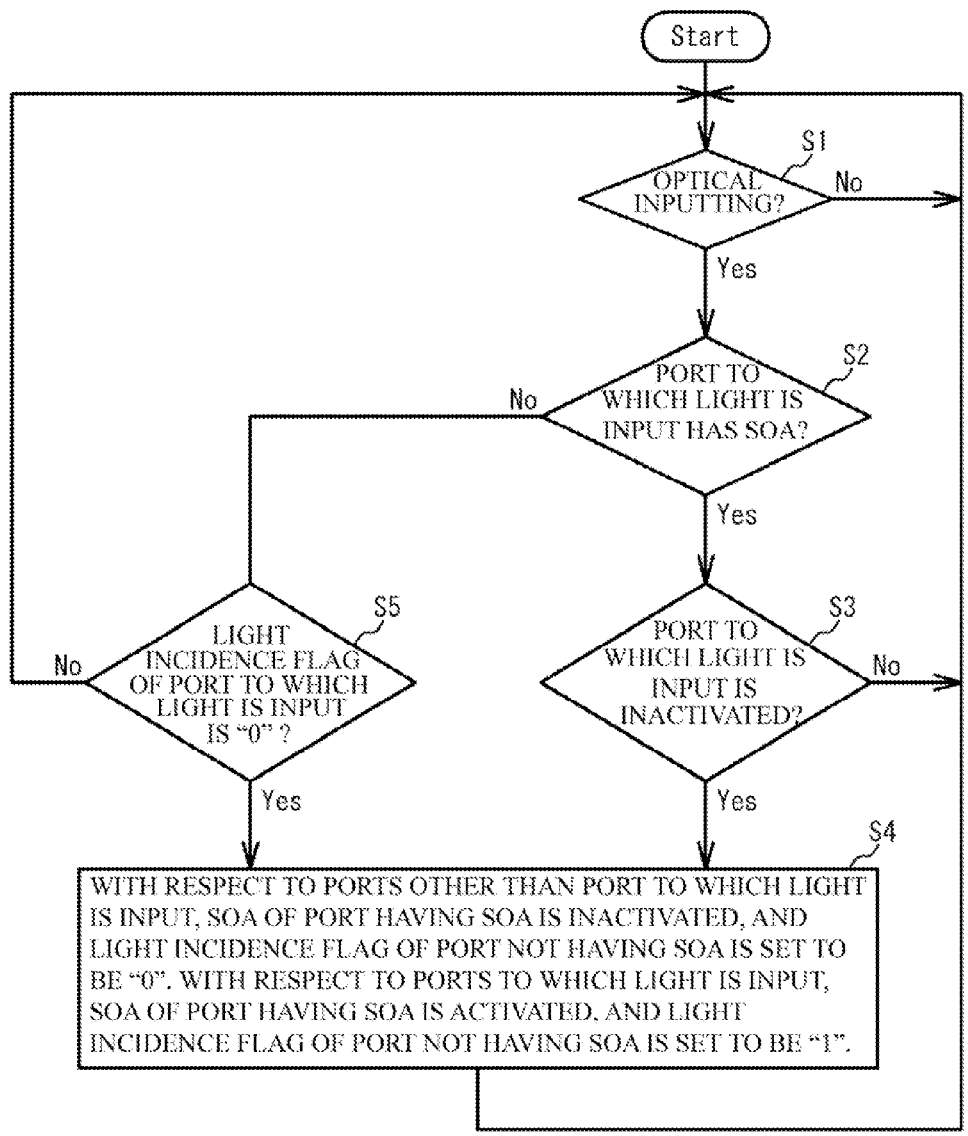
FIG. 6 illustrates a flowchart of an example of an operation of the optical amplification device.

FIG. 6 illustrates a flowchart of an example of an operation of the optical amplification device 100. As illustrated in FIG. 6, the overall control unit 10 determines whether an optical burst signal is input into any of the ports (Step S1). In concrete, the overall control unit 10 determines whether a rising detection signal is output from any of the ports. When it is determined as "No" in the Step S1, the Step S1 is executed again. When it is determined as "Yes" in the Step S1, the overall control unit 10 determines whether a port into which the optical burst signal is input has the SOA 210 (Step S2). In the embodiment, the overall control unit 10 determines whether the port into which the optical burst signal is input is the port of #1 or the port of #2 or #3.

When it is determined as "Yes" in the Step S2, the overall control unit 10 determines whether the SOA 210 of the level control device 20 having detected the rising edge is inactivated (Step S3). In concrete, the overall control unit 10 determines whether the drive circuit 25 of the level control device 20 having detected the rising edge controls the drive voltage to zero.

When it is determined as "No" in the Step S3, the Step S1 is executed again. When it is determined as "Yes" in the Step S3, the overall control unit 10 transmits an off-signal to the drive circuit 25 having the SOA 210 of the port other than the port in which inputting of an optical burst signal is detected, and sets a the light incidence flag of the port that does not have the SOA 210 to be "0". The drive circuit 25 having received the off-signal controls the drive voltage of the SOA 210 to be zero. In the port in which the optical burst signal is detected, the individual control unit 23 gives the on-level to the numeration table unit 24. Thus, the SOA 210 is activated (Step S4). After execution of the Step S4, the Step S1 is executed again.

When it is determined as "No" in the Step S2, the overall control unit 10 determines whether the light incidence flag of the port into which the optical burst signal is input is "0" (Step S5). When it is determined as "No" in the Step S5, the Step S1 is executed again. When it is determined as "Yes" in the Step S5, the overall control unit 10 sets the light incidence flag of the port to be "1", and transmits an off-signal to the drive circuit 25 of the port having the SOA 210 (Step S4). After execution of the Step S4, the Step S1 is executed again.

In the embodiment, as falling edge of an optical signal is not detected. Therefore, when one of the SOAs 210 is activated, the activation is remained until another rising edge is detected in another port. In this case, even if a continuing of zero continues in the optical burst signal, the activation of the SOA 210 of the port number where the rising edge is detected is remained. Therefore, the optical intensity of the optical burst signal can be stabilized. On the other hand, the SOA 210 of another level control device 20 is inactivated. Therefore, a noise caused by the SOA 210 of other level control device 20 can be suppressed, and a degradation of system efficiency is suppressed. And, the effect is also achieved even if there is a port having the SOA 210 and there is a port not having the SOA 210.

Figure 7:
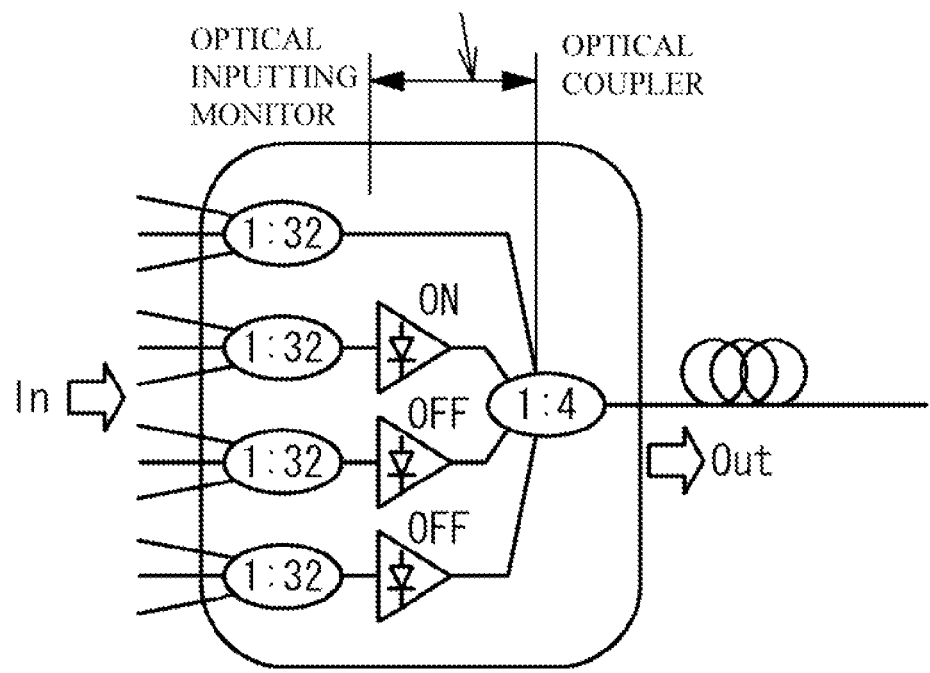
FIG. 7 illustrates a variability of an optical length from a light-receiving element to an optical coupler.

In the embodiment a plurality of the ports are provided. It is therefore preferable that a time from a detection time of a rising edge to a time when the rising edge reaches the optical coupler 204 is not variable among each port. For example, it is preferable that a deviation of the time from the detection time of the rising edge to the time when the rising edge reaches the optical coupler 204 is within 512 nsec among the ports. For example, the deviation can be achieved by reducing a variability of the optical length of each port. As an example, with reference to FIG. 7, the deviation can be achieved when the variability of the optical lengths from the light-receiving elements 22 acting as an optical inputting monitor to the optical coupler 204 is 102.4 m or less. It is preferable that a deviation of a response time of each level control device 20 is a few nano seconds or less.

Figure 8:
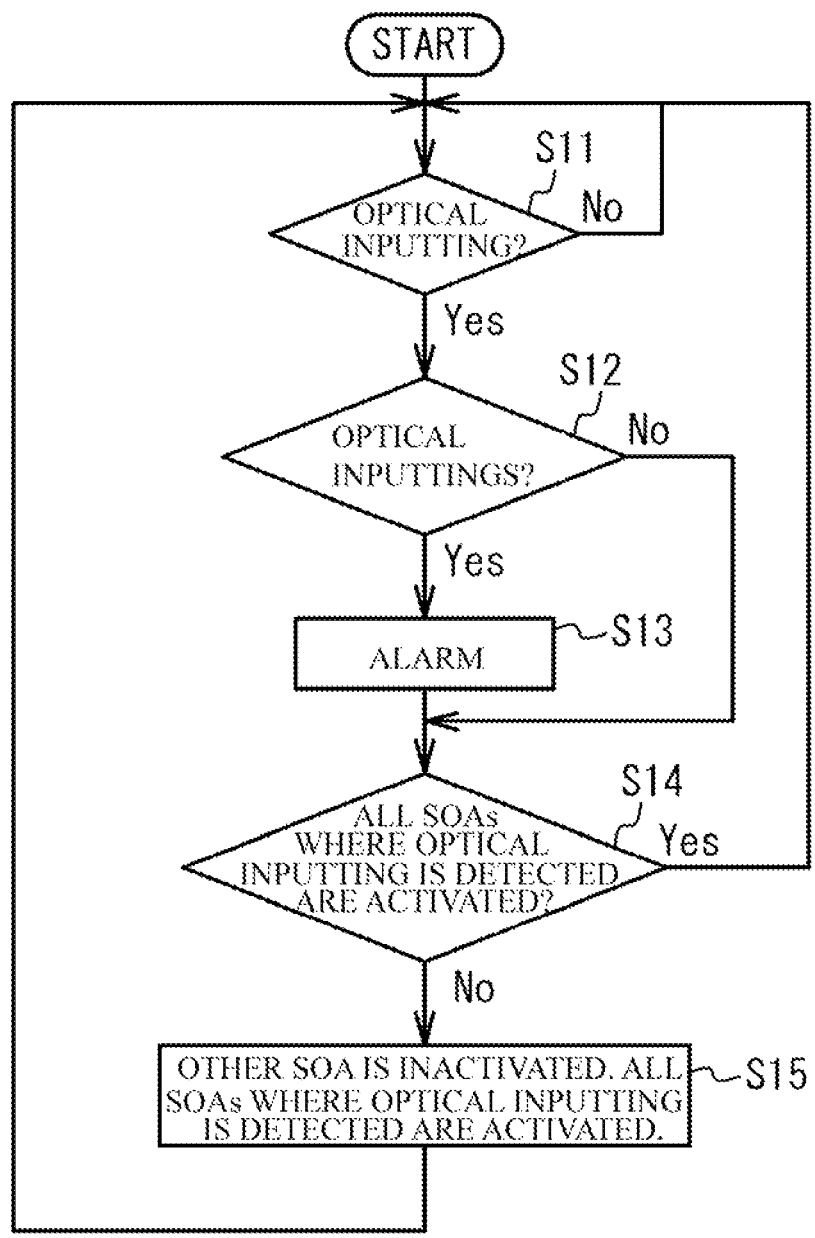
FIG. 8 illustrates as flowchart of an example of an operation in a case where optical inputting, from a plurality of ONUs is detected in the optical amplification device.

There is a case where an optical transmitter of an ONU is out of folder, and emits a light continuously. When a first ONU transmits an optical burst signal and a second ONU emits a light during the transmitting of the first ONU, the light from the second ONU is overlapped with the optical burst signal and the optical burst signal may be degraded. And so, it is preferable that an alarm is output when an optical inputting is detected by a plurality of the light-receiving elements 22 at a time. FIG. 8 illustrates a flowchart of an example of an operation of the optical amplification device 100 in a case where optical inputting from a plurality of ONUs is detected in the optical amplification device 100.

As illustrated in FIG. 8, the overall control unit 10 determines whether an optical burst signal is input into any of ports (Step S11). In concrete, the overall control unit 10 determines whether a rising detection signal is output from any of the ports. When it is determined as "NO" in the Step S11, the Step S11 is executed again. When it is determined as "Yes" in the Step S11, the overall control unit 10 determines whether optical inputting is detected in a plurality of the ports (Step S12). In concrete, the overall control unit 10 determines whether an optical intensity detected by two or more light-receiving elements 22 is equal to a threshold or more.

When it is determined as "Yes" in the Step S12, the overall control unit 10 outputs a signal for informing an alarm to an outer component (Step S13). When it is determined as "No" in the Step S12 or after the execution of the Step S13, the overall control unit 10 determines whether the SOAs 210 of the ports having the SOA 210 among the ports where the optical inputting, is detected are activated (Step S14). When it is determined as "Yes" in the Step S14, the Step S11 is executed again. When it is determined as in the Step S14, the overall control unit 10 activates the SOAs 210 of all ports having the SOA 210 among the ports where the optical inputting is detected, and inactivates the SOAs 210 of the other ports (Step S15). After that, the Step S11 is executed again.

When an optical inputting is detected in a plurality of the ports at a time, an alarm may be output. In a registration process of a new ONU (Ranging Window), a collision of optical burst signals may occur. Therefore, during the registration process of the new ONU, only an alarm may be output, and the ONU may be determined as breakdown when an optical burst signal is input into a plurality of ports at a time in a process other than the registration process of the new ONU.

In the embodiment, there are a plurality of ports having the SOA 210. Therefore, when an optical inputting is detected in the port having the SOA 210, an off-signal is transmitted to another port having the SOA 210. When the number of the port having the SOA 210 is one, the off-signal is not transmitted when an optical inputting is detected in the port.

Second Embodiment

Figure 9:
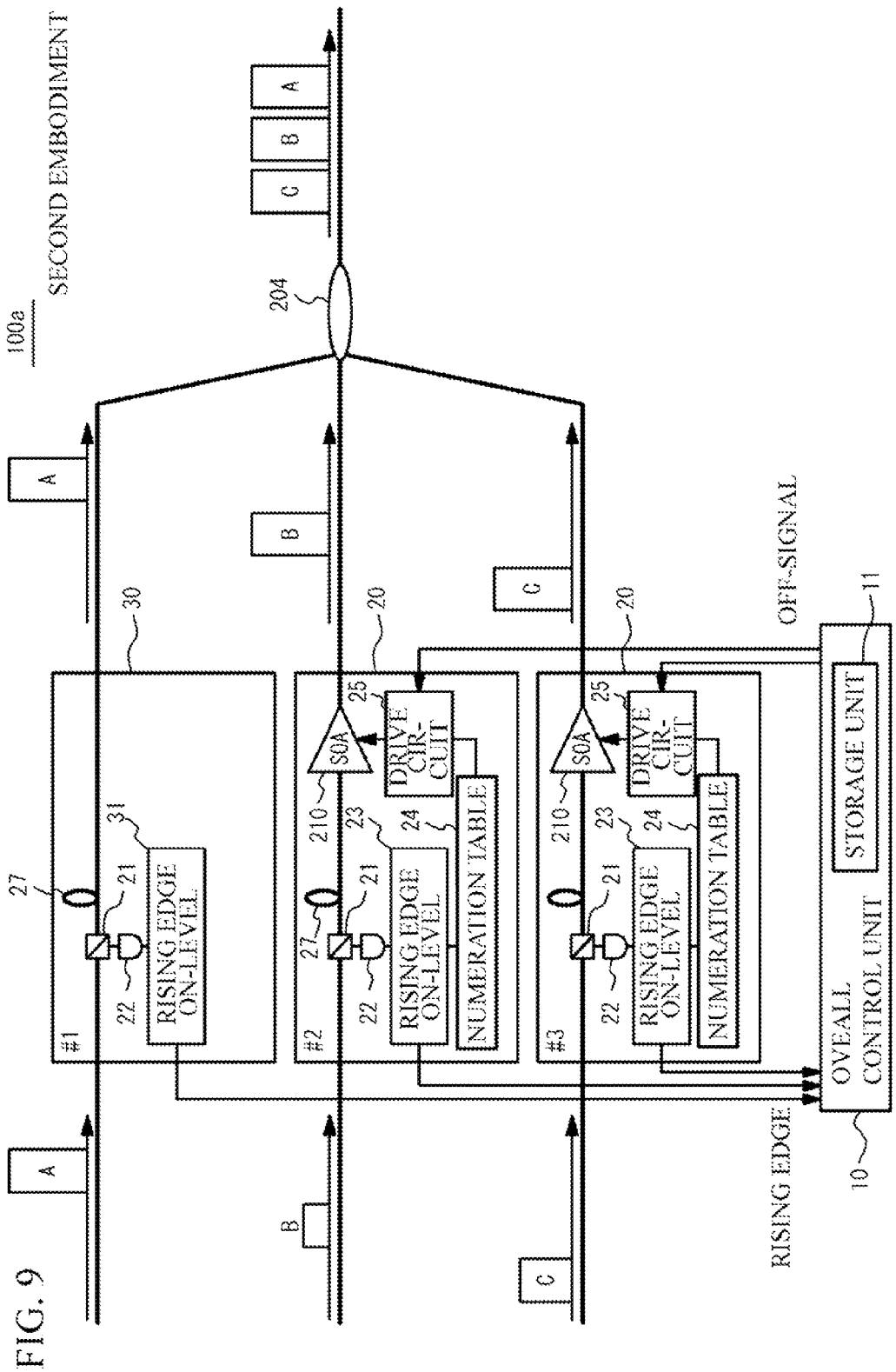
FIG. 9 illustrates a block diagram of an overall structure of an optical amplification device in accordance with a second embodiment.

FIG. 9 illustrates a block diagram of an overall structure of an optical amplification device 100a in accordance with a second embodiment. The optical amplification device 100a is different from the optical amplification device 100 of FIG. 5 in a point that the overall control unit 10 has a storage unit 11. In the embodiment, the storage unit 11 stores a port number as identification information for identifying the ports in which an optical inputting is detected by of the light-receiving elements 22 at a time. When a combination of port numbers stored in the storage unit 11 is changed, the overall control unit 10 forcibly shuts down the port of a common port number. In this case, the overall control unit 10 controls the drive current to the SOA 210 of the port having the SOA 210, and transmits a signal of a forcible shut down to a source of the optical inputting with respect to the port that does not have the SOA 210. Thus, the optical inputting from the ONU that is likely to emit a light continuously can be controlled. Therefore, it is possible to continue a communication between the ONU and the OLT.

Figure 10:
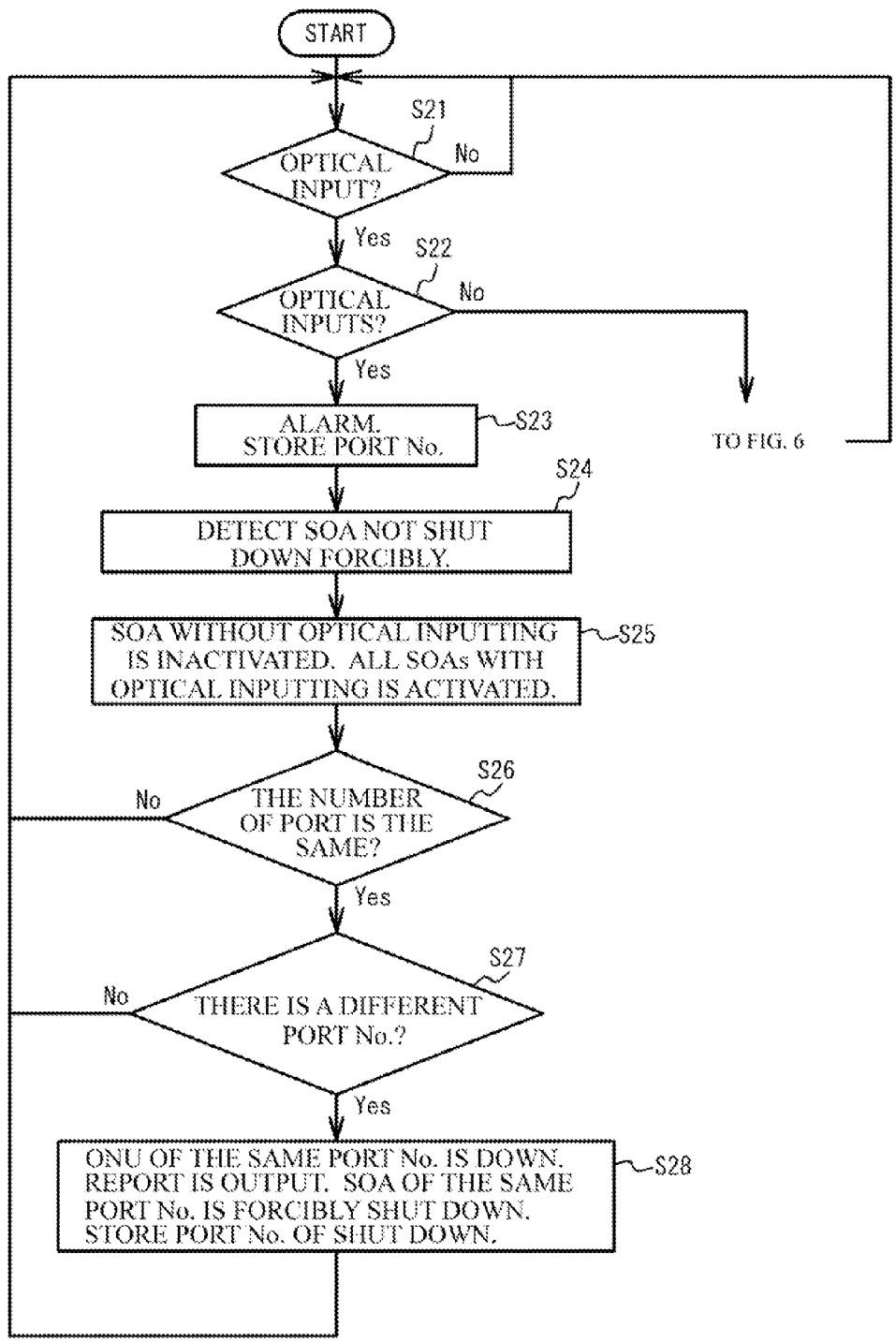
FIG. 10 illustrates a flowchart of an example of an operation in as case where optical inputting from a plurality of ONUs is detected in the optical amplification device.

FIG. 10 illustrates a flowchart of an example of an operation of the optical amplification device 100a in a case where an optical inputting from to plurality of ONUS is detected in the optical amplification device 100a. As illustrated in FIG. 1 the overall control unit 10 determines whether an optical burst signal is input to any of the ports (Step S21). In concrete, the overall control unit 10 determines whether a rising detection signal is output from any of the ports. When it is determined as "No" in the Step S21, the Step S21 is executed again. When it is determined as "Yes" in the Step S21, the overall control unit 10 determines whether an optical inputting is detected in a plurality of the ports (Step S22).

When it is determined as "Yes" in the Step S22, the overall control unit 10 outputs as signal for informing an alarm to an outer component, and makes the storage unit 11 store a port number of the port in which the optical inputting is detected (Step S23). Next, the overall control unit 10 detects the port that is not start-down in the ports in which an optical inputting is detected (Step S24). Next, the overall control unit 10 considers the port that is forcibly shut-down as ineligible, inactivates the SOA 210 of the port in which the optical inputting is not detected, and activates all of the SOAs 210 of the ports in which the optical inputting is detected (Step S25).

Next, the overall control unit 10 determines whether the number of the ports in which the optical inputting is detected is the same as the last number of ports (Step S26). When it is determined as "No" in the Step S26, the step S21 is executed again. When it is determined as "Yes" in the Step S26, the overall control unit 10 checks the last input port numbers and input port numbers of this time, and determines whether there is a different input port number (Step S27). When it is determined as "No" in the Step S27, the Step S21 is executed again. When it is determined as "Yes" in the Step S27, the overall control unit 10 determines that the ONU that inputs a light to the port of a common port number between the last time and this time is out of order, outputs information of the determination to the outer component, and forcibly shuts-down the port. And, the overall control unit 10 stores as port number that is forcibly shut-down (Step S28). After that, the Step S21 is executed again. When it is determined as "No" in the Step S22, the Steps S2 to S5 of FIG. 6 are executed. When the Step S1 is executed again in FIG. 6, the Step S21 is executed again in FIG. 10.

Figure 11:
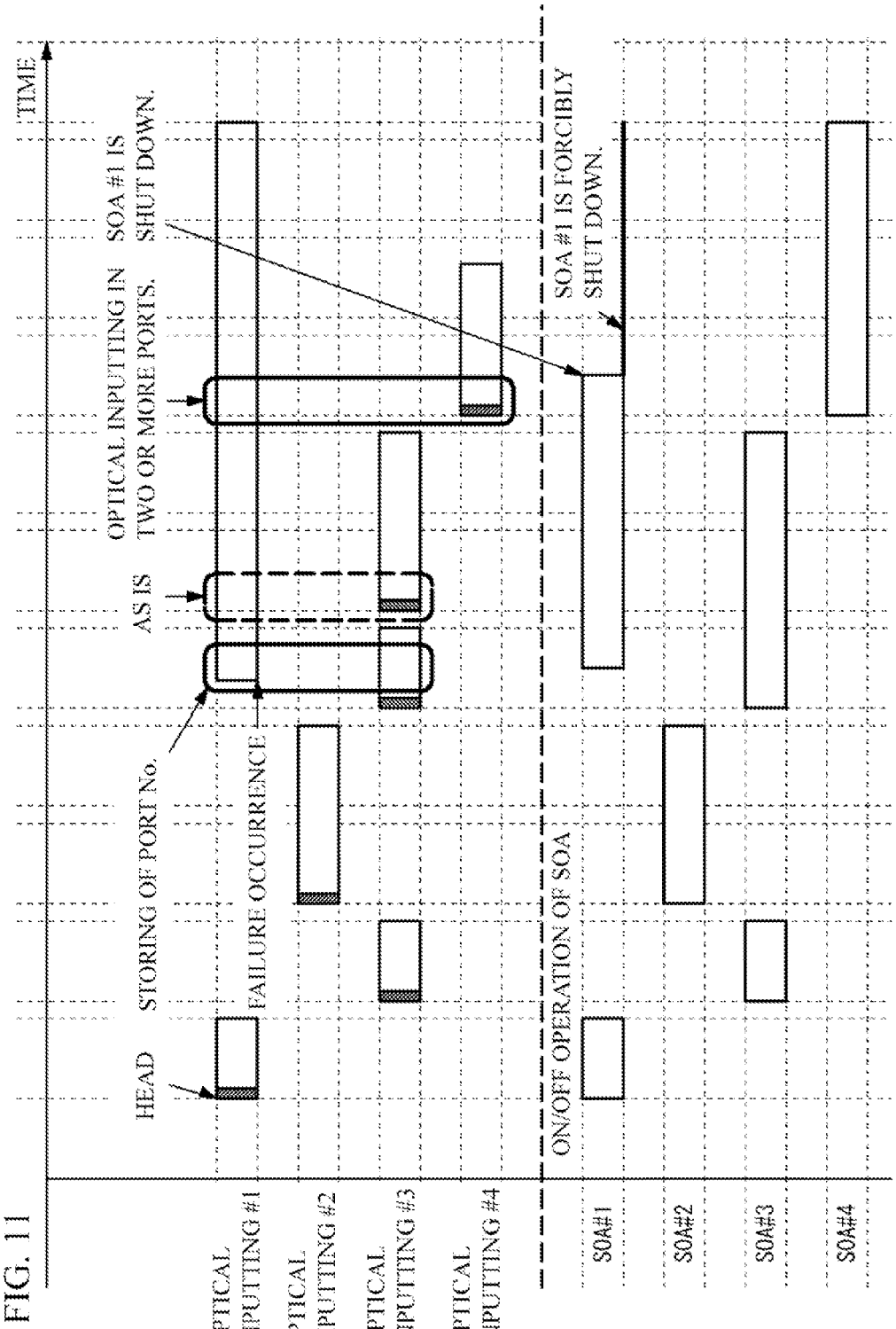
FIG. 11 illustrates an example of a time chart for describing a method in accordance with the flowchart of FIG. 10.

FIG. 11 illustrates an example of a time chart for describing a process in accordance with the flowchart of FIG. 10. As illustrated in FIG. 11, when an optical inputting is detected in any of the ports, the SOA 210 of the port is activated when the port has the SOA 210. When another port other than the port in which the optical inputting is detected has the SOA 210, the SOA 210 is inactivated. In the example of FIG. 11, an optical burst signal is input into the ports of #1, #3, #2 and #3 in order.

When the ONU connected to the port of #1 emits a light because of a breakdown during inputting of an optical burst signal to the port of an optical inputting is detected in the ports of #1 and #3 at a time. In this case, the overall control unit 10 makes the storage unit 11 store the port numbers of #1 and #3. Although the optical burst signal input into the port of #3 is broken down during remaining of the emitting by the ONU, the overall control unit 10 does not use the breakdown of the optical inputting as a process or a control.

When an optical burst signal is input into the port of #3 again, the overall control unit 10 detects that an optical inputting is detected in the ports of #1 and #3. In this case, the overall control unit 10 checks port numbers in which an optical inputting is detected at a present time and stored port numbers. When the port numbers are the same as a result of the checking, the overall control unit 10 remains the stored port numbers.

When the inputting of an optical burst signal to the port of #3 is broken down and an optical burst signal is input into the port of #4, the overall control unit 10 detects that an optical inputting is detected in the ports of #1 and #4. In this case, the overall control unit 10 checks the port numbers in which an optical inputting is detected at a present time and the stored port numbers. As a result of the checking, one port number (#1) corresponds to each other and the other port number does not correspond to each other. Therefore, the overall control unit 10 determines that the ONU inputting a light to the port of #1 is out of order. In this case, the overall control unit 10 forcibly shuts down the port of #1. Because the port of #1 does not have the SOA 210, a signal or forcible shut down is transmitted to a source that transmits an optical burst signal to the port of #1.

In accordance with the embodiment, when an optical inputting is detected in a plurality of the ports at a time, the ONUs emitting, a light at a time can be specified. In a registration process of a new ONU (Ranging Window), a collision of optical burst signals may occur. Therefore, the embodiment may be applied to other than the registration process of the new ONU.

Third Embodiment

Figure 12:
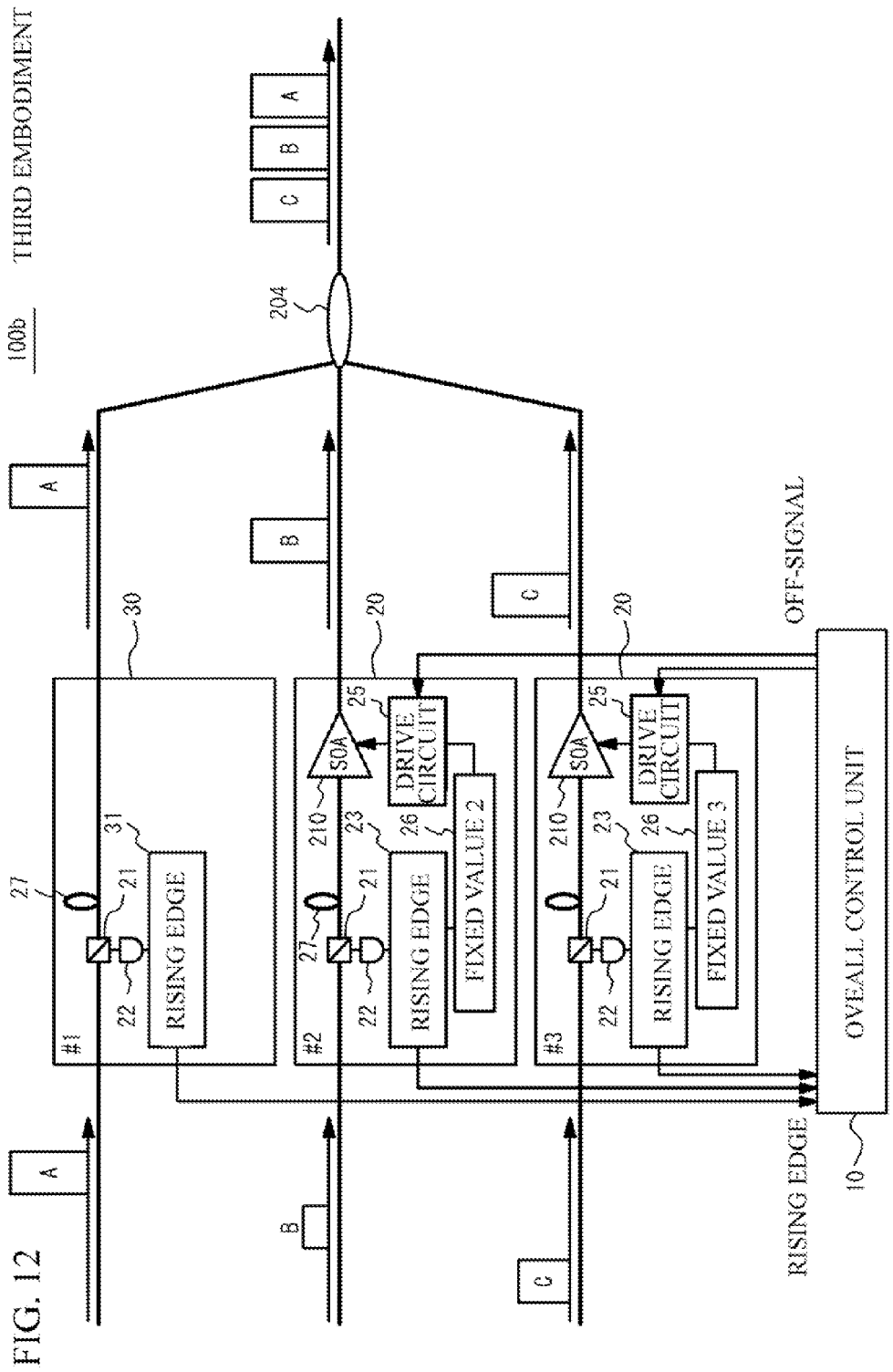
FIG. 12 illustrates a block diagram of an overall structure of an optical amplification device in accordance with a third embodiment.

FIG. 12 illustrates a block diagram of an overall structure of an optical amplification device 100*b* in accordance with a third embodiment. The optical amplification device 100*b* is different from the optical amplification device 100 of FIG. 5 in a point that a fixed-value remain unit 26 is provided instead of the numeration table unit 24 in each level control device 20. The fixed-value remain unit 26 is different from the numeration table unit 24, and remains a fixed drive voltage. The fixed drive voltage value is set in accordance with an optical loss amount occurring in a path from the SOA 210 of each port number to the ONU. In concrete, the larger the optical loss amount occurring in the path from the SOA 210 to the ONU is, the larger the drive voltage value is remained. The smaller the optical loss amount occurring in the path from the SOA 210 to the ONU is, the smaller the drive voltage value is remained.

In the embodiment, the individual control unit 23 does not read an optical intensity after a rising edge (on-level) when detecting a rising edge of an optical burst signal. The fixed-value remain unit 26 gives a remained drive voltage value to the drive circuit 25 when detecting the rising edge. The drive circuit 25 applies a drive voltage of as received drive voltage value to the SOA 210. Thus, the SOA 210 is activated, and an optical level of an optical burst signal input into the SOA 210 is controlled, to be a desirable value.

In accordance with the embodiment, a process may be simplified. And, a data amount of the numeration table or the like may be reduced. The embodiment can be applied to the first embodiment and the second embodiment. In concrete, the fixed-value remain unit 26 may be provided instead of the numeration table unit 24 in the first embodiment and the second embodiment.

Although a rising edge is detected when detecting an optical inputting in the above-mentioned embodiments, the structure is not limited. For example, an optical inputting may be detected in accordance with an input optical intensity. And, although the number of the port not having the SOA is one, the number of the port not having the SOA may be two or more.

All examples and conditional language, recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. An optical amplification device comprising:
a port group that has a plurality of ports that have a semiconductor optical amplifier and a port that does not have a semiconductor optical amplifier, an optical burst signal being input into each of the ports at a different timing;
an optical coupler that combines output signals output from the port group;
a detection unit that detects each optical inputting to each of the plurality of ports of the port group; and
a control unit,
wherein:
when an optical inputting into one of the plurality of ports that has the semiconductor optical amplifier is detected, the control unit activates the semiconductor optical amplifier of the one of the plurality of ports where the optical inputting is detected, inactivates the other semiconductor optical amplifier and remains an activation of the one of the plurality of ports until another optical inputting is detected in another port; and
when an optical inputting into the port that does not have the semiconductor optical amplifier is detected, the control unit inactivates the semiconductor optical amplifiers of the plurality of the ports that have the semiconductor optical amplifier.

2. The optical amplification device as claimed in claim 1, wherein the control unit outputs a signal for informing an alarm when the optical inputting is detected in two or more semiconductor optical amplifiers at a time.

3. The optical amplification device as claimed in claim 1, further comprising:
a storage unit that stores identification information of two or more ports where the optical inputting is detected at a time,
wherein when a combination of the ports stored in the storage unit is changed, the control unit inactivates optical output of a common port stored in the storage unit in the combinations.

4. The optical amplification device as claimed in claim 1, wherein among the plurality of semiconductor optical amplification devices, a deviation among times from a starting time of the detection of the optical inputting by the detection unit to a time when a light regarding the optical inputting reaches the optical coupler is within 512 nsec.

5. An optical amplification method of an optical amplification device combining output signals output by a port group that has a plurality of ports that have a semiconductor optical amplifier and a port that does not have a semiconductor optical amplifier, an optical burst signal being input into each of the ports at a different timing, the method comprising:
when an optical inputting into one of the plurality of ports that has the semiconductor optical amplifier is detected, activating the semiconductor optical amplifier of the one of the plurality of ports where the optical inputting is detected, inactivating the other semiconductor optical amplifier, and remaining an activation of the one of the plurality of ports until another optical inputting is detected in another port; and
when an optical inputting into the port that does not have the semiconductor optical amplifier is detected, inactivating the semiconductor optical amplifiers of the plurality of the ports that have the semiconductor optical amplifier.

6. An optical amplification device comprising:
a first port that has a semiconductor optical amplifier, an optical burst signal being input into the first port;

a second port that does not have a semiconductor optical amplifier, an optical burst signal being into the second port at a different timing from the first port;

an optical coupler that combines output signals output from the first port and the second port;

a detection unit that detects each optical inputting to each of the first port and the second port; and a control unit, wherein:

when an optical inputting into the first port is detected, the control unit activates the semiconductor optical amplifier and remains an activation until another optical inputting is detected in the second port; and when an optical inputting into the second port is detected, the control unit inactivates the semiconductor optical amplifiers of first port.

7. An optical amplification method of an optical amplification device combining output signals output by a first port that has a semiconductor optical amplifier and a second port that does not have a semiconductor optical amplifier, an optical burst signal being input into each of the first and second ports at a different timing, the method comprising:

when an optical inputting into the first port is detected, activating the semiconductor optical amplifier and remaining an activation until another optical inputting is detected in the second port; and when an optical inputting into the second port is detected, inactivating the semiconductor optical amplifiers of first port.

\* \* \* \* \*